(12) United States Patent
Lee

(10) Patent No.: US 9,246,490 B1
(45) Date of Patent: Jan. 26, 2016

(54) ONE-SHOT CIRCUIT

(71) Applicant: Himax Analogic, Inc., Tainan (TW)

(72) Inventor: Chow-Peng Lee, Tainan (TW)

(73) Assignee: HIMAX ANALOGIC, INC., Tainan (TW)

( * ) Notice: Subject to any disclaimer, the term of this patent is extended or adjusted under 35 U.S.C. 154(b) by 0 days.

(21) Appl. No.: 14/461,161

(22) Filed: Aug. 15, 2014

(51) Int. Cl.
*H03K 19/00* (2006.01)
*H03K 19/0175* (2006.01)
*H03K 19/094* (2006.01)
*G06F 1/04* (2006.01)
*H03K 19/003* (2006.01)

(52) U.S. Cl.
CPC ............. *H03K 19/003* (2013.01); *G06F 1/04* (2013.01); *H03K 19/0175* (2013.01)

(58) Field of Classification Search
CPC ............................ H03K 19/003; G06F 1/04
USPC ............ 326/93, 95, 98, 81, 83; 327/209–212, 327/214, 215, 224, 225
See application file for complete search history.

(56) References Cited

U.S. PATENT DOCUMENTS

| | | | | |
|---|---|---|---|---|
| 6,049,488 A | * | 4/2000 | Sawada | G11C 7/1051 365/189.05 |
| 8,199,859 B2 | * | 6/2012 | Zerbe | H04L 25/03057 327/336 |
| 2004/0012580 A1 | * | 1/2004 | Yamagishi | G09G 3/3688 345/204 |
| 2004/0246246 A1 | * | 12/2004 | Tobita | G09G 3/20 345/205 |

* cited by examiner

*Primary Examiner* — Dylan White
(74) *Attorney, Agent, or Firm* — Locke Lord LLP; Tim Tingkang Xia, Esq.

(57) ABSTRACT

A one-shot circuit that includes a fixed-voltage generating module, a clock-shifting module and a logic operation module is provided. The fixed-voltage generating module is operated according to a system voltage to generate a fixed voltage smaller than the system voltage and not varied accordingly. The clock-shifting module includes a delay circuit and at least one first inverter. The delay circuit receives and delays a clock signal to generate a first delayed clock signal. The first inverter is electrically connected to the delay circuit to be operated according to the fixed voltage to receive the first delayed clock signal and generate a second delayed clock signal that is delayed for a predetermined time period relative to the clock signal. The logic operation module receives the clock signal and the second delayed clock signal to perform a logic operation to generate a one-shot signal.

12 Claims, 4 Drawing Sheets

ONE-SHOT CIRCUIT

BACKGROUND

1. Field of Invention

The present invention relates to an electronic circuit. More particularly, the present invention relates to a one-shot circuit.

2. Description of Related Art

There are many instances when it is desirable to generate a pulse of short duration in response to a predetermined change in an input signal, such as a voltage rise, for driving or triggering another circuit. In particular, computer circuits commonly require a single trigger pulse of relatively short duration in response to a particular occurrence or change in a timing signal, such as, for example, the positive-going portion of a periodically-recurring clock pulse. In logic circuits and computers it is important to provide a precise one-shot signal having a pulse width that does not vary even when the supply voltage of the one-shot circuit varies.

Accordingly, what is needed is a one-shot circuit to address the issues mentioned above.

SUMMARY

An aspect of the present invention is to provide a one-shot circuit. The one-shot circuit includes a fixed-voltage generating module, a clock-shifting module and a logic operation module. The fixed-voltage generating module is operated according to a system voltage to generate a fixed voltage that is smaller than the system voltage and is not varied according to the system voltage. The clock-shifting module includes a delay circuit and at least one first inverter. The delay circuit receives and delays a clock signal to generate a first delayed clock signal. The first inverter is electrically connected to the delay circuit to be operated according to the fixed voltage to obtain a fixed transition point such that the first inverter receives the first delayed clock signal to generate a second delayed clock signal that has a period the same as that of the clock signal and is delayed for a predetermined time period relative to the clock signal. The logic operation module receives the clock signal and the second delayed clock signal to perform a logic operation to generate a one-shot signal.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
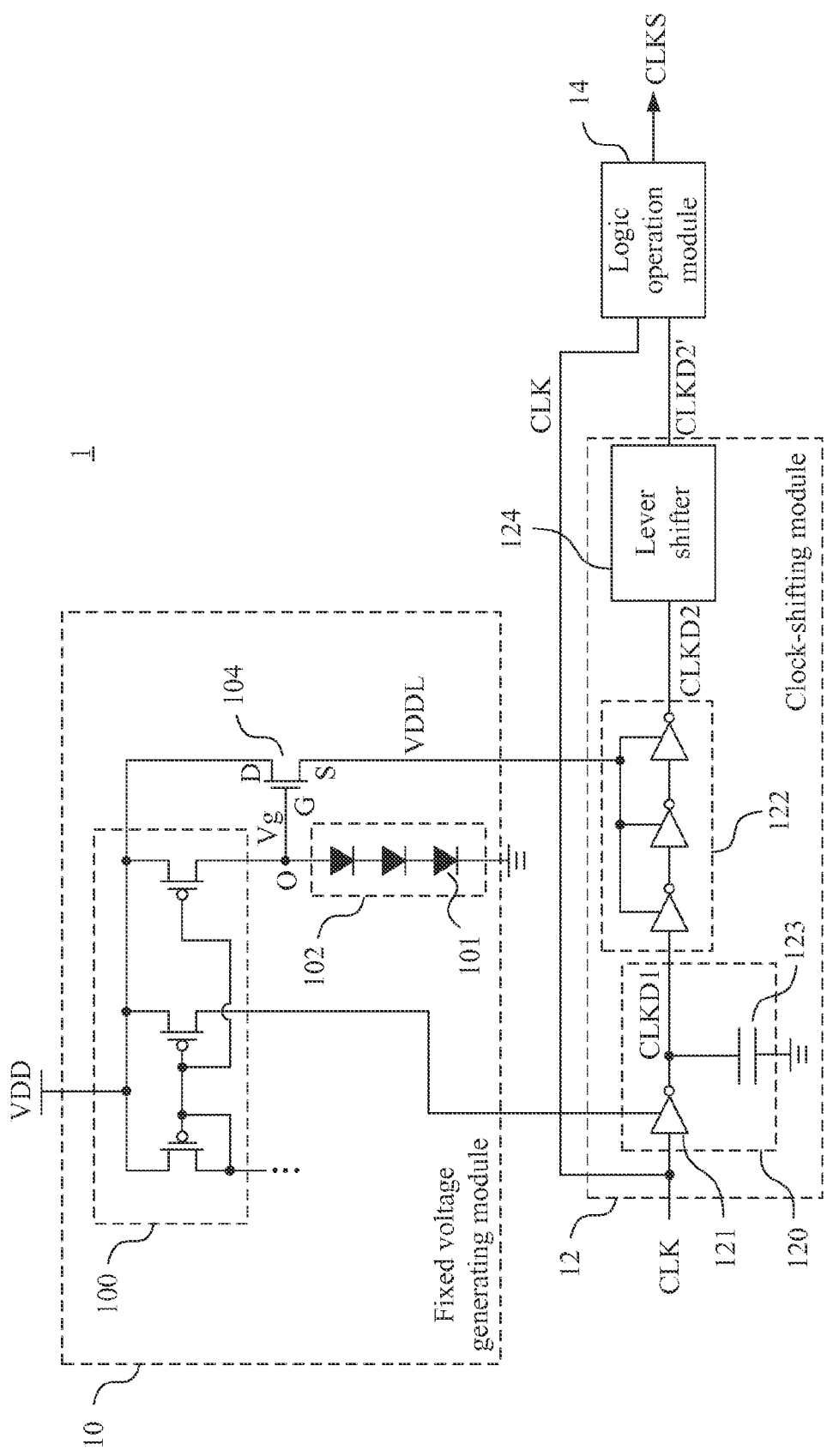
FIG. 1 is a circuit diagram of a one-shot circuit in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a circuit diagram of a one-shot circuit 1 in an embodiment of the present invention. The one-shot circuit 1 includes a fixed-voltage generating module 10, a clock-shifting module 12 and a logic operation module 14.

Each component in the fixed-voltage generating module 10 is operated according to a system voltage VDD. In different embodiments, the value of the system voltage VDD can be such as, but not limited to 3.3 volts, 5 volts or a higher voltage value, depending on different usage scenarios.

The fixed-voltage generating module 10 includes a current source 100, a fixed-voltage load 102 and a transistor 104.

The current source 100 includes a current source output end O. The fixed-voltage load 102 is electrically connected to the current source output end O to fix an output voltage Vg of the current source output end O at a predetermined level. In an embodiment, the fixed-voltage load 102 includes a plurality of diodes 101 connected in series. As a result, the voltage level of the output voltage Vg equals to the total cross voltage of the diodes 101. For example, if the cross voltage of one of the conducted diode 101 is 0.7 volts and the fixed-voltage load 102 includes three diodes 101 as illustrated in FIG. 1, the voltage level of the output voltage Vg equals to 2.1 volts.

It is noted that the number of the diodes 101 mentioned above is merely an example. In other embodiments, the number of the diodes can be adjusted according to the practical needs. Further, the fixed-voltage load 102 can be formed by other load components that have similar function as the diodes.

In the present embodiment, the transistor 104 is an N-type transistor. The gate G of the transistor 104 is electrically connected to the current source output end O of the 3 current source 100. The transistor 104 is conducted according to the output voltage Vg to generate a fixed voltage VDDL at the source S of the transistor 104. The fixed voltage VDDL is smaller than the system voltage VDD and is not varied according to the system voltage VDD.

In an embodiment, the voltage level of the fixed voltage VDDL equals to the difference of the voltage value of the output voltage Vg and a threshold voltage Vth of the transistor.

When the output voltage Vg equals to the total cross voltage of the three diodes 101 and when the threshold voltage Vth of the transistor 104 is 0.5 volts, the voltage level of the fixed voltage VDDL is 2.1−0.5=1.6 volts.

It is noted that the N-type transistor mentioned above is merely an example. In other embodiments, the P-type transistor can be used to generate the fixed voltage VDDL when appropriate adjustment of the circuit structure is made. Moreover, the circuit to generate the fixed voltage VDDL is not limited to the circuit illustrated in FIG. 1. In other words, the fixed voltage VDDL can be generated by other circuits or methods.

The clock-shifting module 12 includes a delay circuit 120 and first inverters 122.

Figure 2:
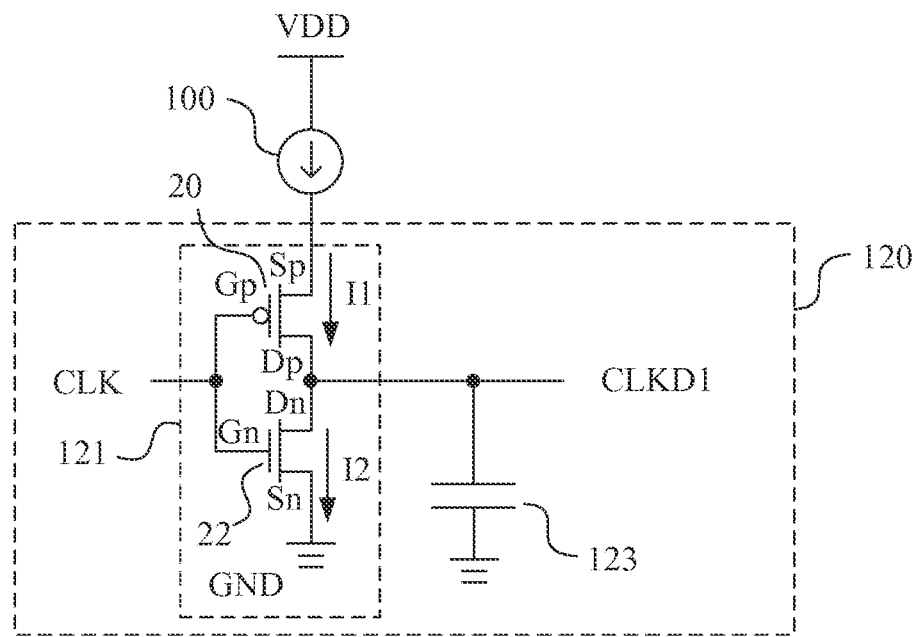
FIG. 2 is a detailed circuit diagram of the delay circuit in an embodiment of the present invention.

FIG. 2 is a detailed circuit diagram of the delay circuit 120 in an embodiment of the present invention.

The delay circuit 120 receives and delays a clock signal CLK to generate a first delayed clock signal CLKD1. In the present embodiment, the delay circuit 120 includes a second inverter 121 and a capacitor 123.

In the present embodiment, the second inverter 121 includes a charging path formed by a P-type transistor 20 and a discharging path formed by a N-type transistor 22. The drains Dp and Dn of the P-type and N-type transistors 20 and 22 are electrically connected and are further connected to the capacitor 123.

The gates Gp and Gn of the P-type and N-type transistors 20 and 22 receive the clock signal CLK. In the present embodiment, the source Sp of the P-type transistor 20 is electrically connected to the current source 100 to receive a current I1 therefrom.

Accordingly, the P-type transistor 20 is conducted when the clock signal CLK is at a low state to form the charging path such that the capacitor 123 is charged by the current I1. On the other hand, the source Sn of the N-type transistor is electrically connected to a ground potential GND. Accordingly, the N-type transistor 22 is conducted when the clock signal CLK is at a high state to form the discharging path such that the capacitor 123 is discharged by a current I2 that flows through the N-type transistor 22 to the ground potential GND.

As a result, the first delayed clock signal CLKD1 is generated according to the charging and discharging activity performed by the charging path and the discharging path of the second inverter 121 on the capacitor 123.

The first inverters 122 are electrically connected in series and are electrically connected to the delay circuit 120 to be operated according to the fixed voltage VDDL. The first inverters 120 receive the first delayed clock signal CLKD1 to generate a second delayed clock signal CLKD2. The operation of the first inverters 122 and the generation of the second delayed clock signal CLKD2 are further discussed in subsequent paragraphs.

Figure 3:
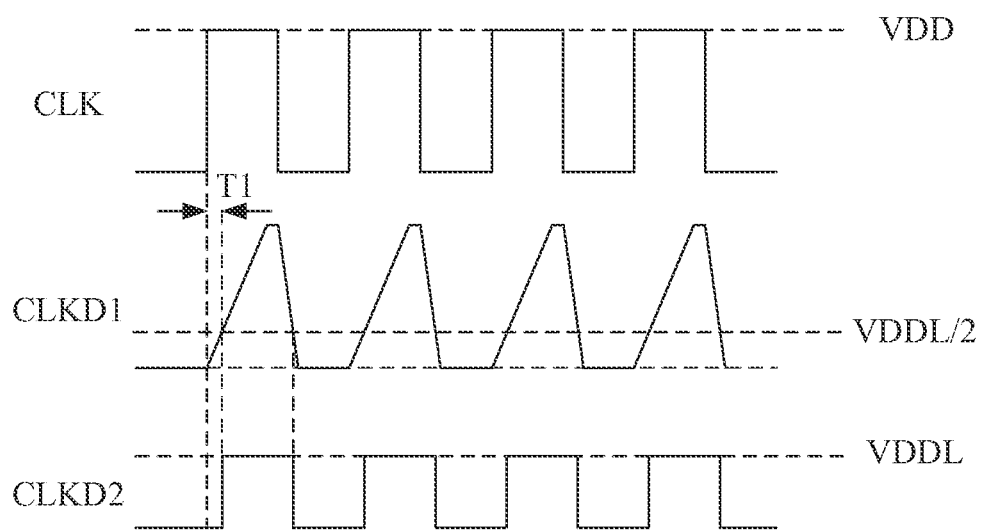
FIG. 3 is a diagram of the waveforms of the clock signal, the first delayed clock signal and the second delayed clock signal in an embodiment of the present invention.

FIG. 3 is a diagram of the waveforms of the clock signal CLK, the first delayed clock signal CLKD1 and the second delayed clock signal CLKD2 in an embodiment of the present invention.

In an embodiment, the delay circuit 120 receives the clock signal CLK that has the voltage level ranging from ground potential to the system voltage VDD. The delay circuit 120 is designed such that the discharging speed of the discharging path in the second inverter 121 is faster than the charging speed of the charging path. Accordingly, the slope of the rising edge of the first delayed clock signal CLKD1 of each time period is smaller than the slope of the falling edge of the same.

Since the first inverter 122 is operated according to the fixed voltage VDDL that does not vary, the voltage level of the transition point of the first inverter 122 is maintained to be a stable and fixed value that is not varied according to the variation of the system voltage VDD. In an embodiment, the voltage level of the transition point is VDDL/2.

Moreover, in an embodiment, the first inverter 122 is implemented by a circuit similar to the second inverter 121 illustrated in FIG. 2. However, the charging and discharging speed of the first inverter 122 is fast to keep a higher transition speed such that the slope of the rising and falling edges of the second clock signal CLKD2 is substantially vertical, which is identical to the original clock signal CLK. It is noted that the term "substantially vertical" means that the rising and the falling edges are not necessarily 90 degrees and may have a tolerable error, such as a range within −5% to +5% of 90 degrees.

As a result, the second delayed clock signal CLKD2 has a period the same as that of the clock signal CLK and is delayed for a predetermined time period T1 relative to the clock signal CLK. Moreover, in the present embodiment, the voltage level of the second clock signal CLKD2 equals to fixed voltage VDDL. The duration of the predetermined time T1 is determined according to the charging and discharging ability of the second inverter 121 and the number of the first inverter 122. In FIG. 3, only the amount of delay generated according to the charging and discharging ability of the second inverter 121 is presented. The effect of the number of the first inverter 122 is neglected.

It is noted that the number of the first inverters 122 illustrated in FIG. 1 is merely an example. In other embodiments, the number of the first inverters can be adjusted according to the practical needs.

In an embodiment, the clock-shifting module 12 in FIG. 1 further includes a level shifter 124 to increase the voltage level of the second delayed clock signal CLKD2 to generate the second delay clock signal CLKD2'. The voltage level of the second delay clock signal CLKD2' is increased to be the same as the clock signal CLK. In different embodiments, the level shifter 124 can be implemented by various kinds of circuits.

The logic operation module 14 receives the clock signal CLK and the second delayed clock signal CLKD2' to perform a logic operation thereon to generate a one-shot signal CLKS.

Figure 4:
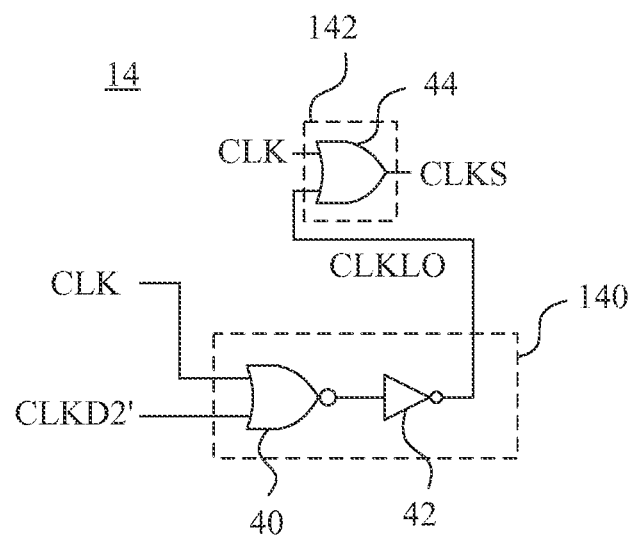
FIG. 4 is a block diagram of the logic operation module in an embodiment of the present invention.
Figure 5:
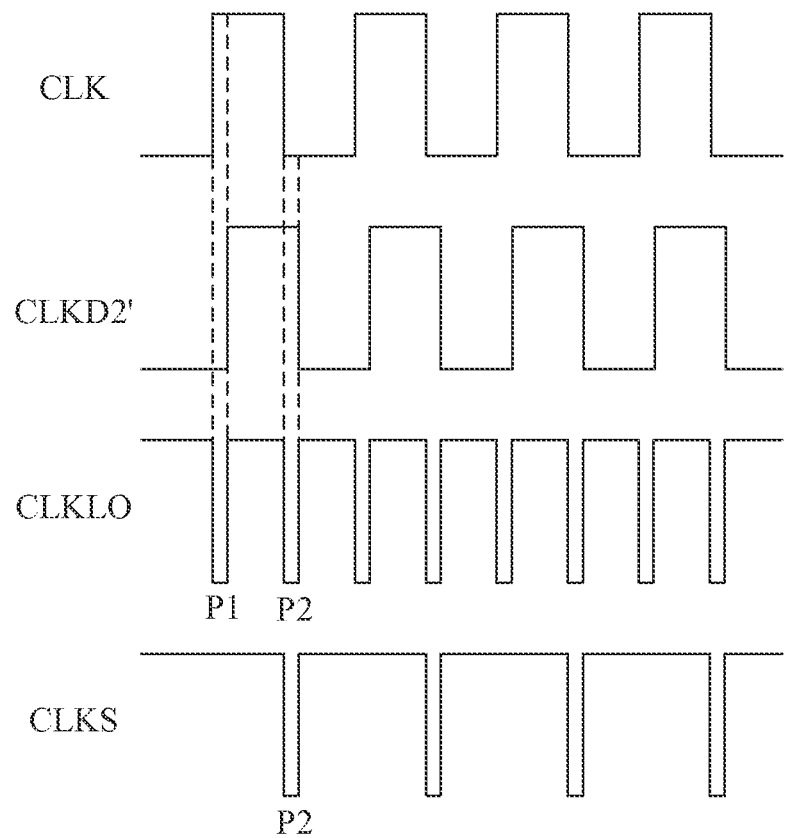
FIG. 5 is a diagram of waveforms of the clock signal, the second delayed clock signal, a logic operation output signal and the one-shot signal in an embodiment of the present invention.

FIG. 4 is a block diagram of the logic operation module 14 in an embodiment of the present invention. FIG. 5 is a diagram of waveforms of the clock signal CLK, the second delayed clock signal CLKD2', a logic operation output signal CLKLO and the one-shot signal CLKS in an embodiment of the present invention.

The logic operation module 14 includes a first logic operation module 140 and a second logic operation module 142. In the present embodiment, the first logic operation module 140 includes an exclusive OR gate 40 and an inverting gate 42. The exclusive OR gate 40 receives the clock signal CLK and the second delayed clock signal CLKD2' to perform a logic operation and further generates the logic operation output signal CLKLO through the inverting gate 42.

The exclusive OR gate 40 outputs a high state when the logic states of the clock signal CLK and the second delayed clock signal CLKD2' are opposite. On the contrary, the exclusive OR gate 40 outputs a low state when the logic states of the clock signal CLK and the second delayed clock signal CLKD2' are the same. As a result, after the process of the inverting gate 42, the first logic operation module 140 generates the logic operation output signal CLKO including two low state pulses P1 and P2, as illustrated in FIG. 5.

The second logic operation module 142 includes a OR gate 44 in the present embodiment to further perform a logic operation on the clock signal CLK and the logic operation output signal CLKO to generate the one-shot signal CLKS.

The OR gate 44 outputs a low state only when the logic states of both of the clock signal CLK and the logic operation output signal CLKO are in the low states. As a result, the one-shot signal CLKS only includes a single low state pulse P2 in each time period, as illustrated in FIG. 5.

Therefore, the fixed-voltage generating module 10 of the one-shot circuit 1 is able to generate a fixed voltage VDDL such that the fixed voltage VDDL is supplied to the first inverter 122 of the clock-shifting module 12 to perform the state transition. The timing variation of the delayed clock signal caused by the variation of the system voltage VDD is avoided when the slopes of the rising and the falling edges of the delayed clock signal generated from the delay circuit 120 are larger. Hence, the delayed clock signal that is not effected by the system voltage VDD is generated. The one-shot signal with greater precision can be generated subsequently.

Figure 6:
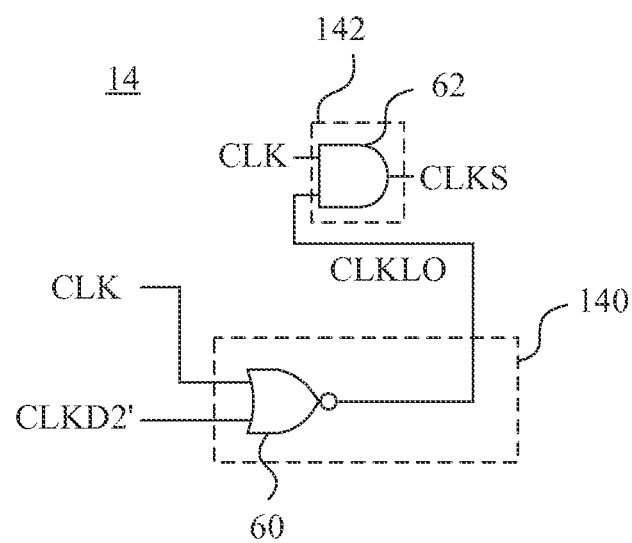
FIG. 6 is a block diagram of the logic operation module in an embodiment of the present invention.
Figure 7:
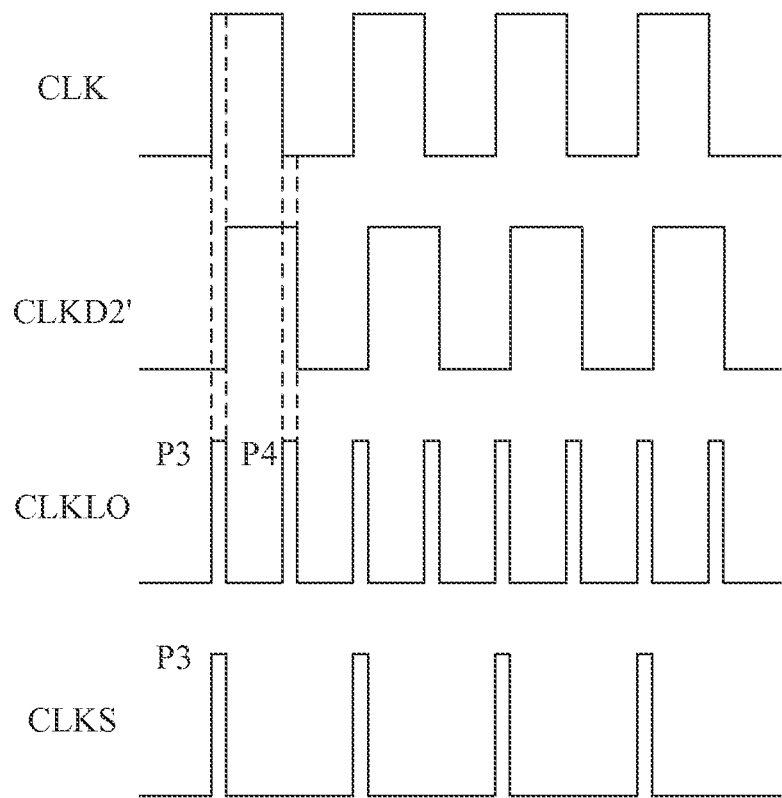
FIG. 7 is a diagram of waveforms of the clock signal, the second delayed clock signal, a logic operation output signal and the one-shot signal in an embodiment of the present invention.

FIG. 6 is a block diagram of the logic operation module 14 in an embodiment of the present invention. FIG. 7 is a diagram of waveforms of the clock signal CLK, the second delayed clock signal CLKD2', a logic operation output signal CLKLO and the one-shot signal CLKS in an embodiment of the present invention.

Similar to the logic operation module 14 illustrated in FIG. 5, the logic operation module 14 shown in FIG. 6 includes the first logic operation module 140 and the second logic operation module 142.

In the present embodiment, the first logic operation module 140 includes an exclusive OR gate 60. The exclusive OR gate 60 receives the clock signal CLK and the second delayed clock signal CLKD2' to perform a logic operation and further generates the logic operation output signal CLKLO.

The exclusive OR gate 60 outputs a high state when the logic states of the clock signal CLK and the second delayed clock signal CLKD2' are opposite. On the contrary, the exclusive OR gate 40 outputs a low state when the logic states of the clock signal CLK and the second delayed clock signal CLKD2' are the same. As a result, the first logic operation module 140 generates the logic operation output signal CLKO including two high state pulses P3 and P4, as illustrated in FIG. 7.

The second logic operation module 142 includes an AND gate 62 in the present embodiment to further perform a logic operation on the clock signal CLK and the logic operation output signal CLKO to generate the one-shot signal CLKS.

The AND gate 62 outputs a high state only when the logic states of both of the clock signal CLK and the logic operation output signal CLKO are in the high states. As a result, the one-shot signal CLKS only includes a single high state pulse P3 in each time period, as illustrated in FIG. 7.

Therefore, the logic operation module 14 can be selectively implemented by the circuit illustrated in FIG. 6.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A one-shot circuit, comprising:
   a fixed-voltage generating module operated according to a system voltage to generate a fixed voltage that is smaller than the system voltage and is not varied according to the system voltage;
   a clock-shifting module comprising:
   a delay circuit to receive and delay a clock signal to generate a first delayed clock signal; and
   at least one first inverter electrically connected to the delay circuit to be operated according to the fixed voltage to obtain a fixed transition point such that the first inverter receives the first delayed clock signal to generate a second delayed clock signal that has a period the same as that of the clock signal and is delayed for a predetermined time period relative to the clock signal; and
   a logic operation module to receive the clock signal and the second delayed clock signal to perform a logic operation to generate a one-shot signal.

2. The one-shot circuit of claim 1, wherein the fixed-voltage generating module comprises:
   a current source comprising a current source output end;
   a fixed-voltage load electrically connected to the current source output end to fix an output voltage of the current source output end at a predetermined level; and
   a transistor, wherein a gate of the transistor is electrically connected to the current source output end such that the transistor is conducted according to the output voltage to generate the fixed voltage at a source/drain of the transistor.

3. The one-shot circuit of claim 1, wherein the fixed-voltage load comprises a plurality of diodes connected in series.

4. The one-shot circuit of claim 3, wherein the fixed voltage is a difference of a total cross voltage of the diodes and a threshold voltage of the transistor.

5. The one-shot circuit of claim 1, wherein the delay circuit comprises a second inverter and a capacitor electrically connected to each other, wherein the second inverter comprises a charging path and a discharging path to charge and discharge the capacitor according to the clock signal to generate the first delayed clock signal.

6. The one-shot circuit of claim 5, wherein a discharging speed of the discharging path of the second inverter is higher than a charging speed of the charging path of the second inverter.

7. The one-shot circuit of claim 1, wherein the clock-shifting module further comprises a level shifter to increase a voltage level of the second delayed clock signal such that the voltage level of the second delayed clock signal equals to the voltage level of the clock signal.

8. The one-shot circuit of claim 1, wherein the logic operation module comprises:
   a first logic operation module to receive the clock signal and the second delayed clock signal to perform a first logic operation to generate a logic operation output signal that comprises two pulses in each time period, wherein the
   logic operation output signal is at a first state corresponding to the two pulses when logic states of clock signal and the second delayed clock signal are opposite and the logic operation output signal is at a second state when the logic states of clock signal and the second delayed clock signal are the same; and
   a second logic operation module to receive the clock signal and the logic operation output signal to perform a second logic operation to generate the one-shot signal comprising one of the two pulses in each time period.

9. The one-shot circuit of claim 1, wherein the first logic operation module comprises an exclusive OR gate and an inverting gate and the second logic operation module comprises an OR gate.

10. The one-shot circuit of claim 1, wherein the first logic operation module comprises an exclusive OR gate and the second logic operation module comprises an AND gate.

11. The one-shot circuit of claim 1, wherein the one-shot signal comprises a single high state pulse in each time period.

12. The one-shot circuit of claim 1, wherein the one-shot signal comprises a single low state pulse in each time period.

* * * * *